United States Patent
Green et al.

(10) Patent No.: US 6,353,317 B1
(45) Date of Patent: Mar. 5, 2002

(54) MESOSCOPIC NON-MAGNETIC SEMICONDUCTOR MAGNETORESISTIVE SENSORS FABRICATED WITH ISLAND LITHOGRAPHY

(75) Inventors: Mino Green, London (GB); Koichi Sassa, Fuchu (JP); Stuart A. Solin, Princeton Junction, NJ (US); Richard A. Stradling, London (GB); Shin Tsuchiya, Saitama (JP)

(73) Assignees: Imperial College of Science, Technology and Medicine, London (GB); NEC Research Institute, Inc., Princeton, NJ (US); Mitsubishi Materials Corporation, Saitama (JP)

( * ) Notice: Subject to any disclaimer, the term of this patent is extended or adjusted under 35 U.S.C. 154(b) by 0 days.

(21) Appl. No.: 09/487,386

(22) Filed: Jan. 19, 2000

(51) Int. Cl.$^7$ ................................................. G01V 3/00
(52) U.S. Cl. ....................................... 324/252; 257/421
(58) Field of Search ................................ 324/252, 257; 338/32 R; 257/25, 77, 194, 280, 421, 425; 360/313, 324; 428/692, 693

(56) References Cited

U.S. PATENT DOCUMENTS 5,937,295 A * 8/1999 Chen et al. ................. 438/257
5,965,283 A * 10/1999 Solin et al. ................. 428/692
6,117,690 A * 9/2000 Bennett et al. ................ 483/3
6,118,623 A * 9/2000 Fatula, Jr. et al. .......... 360/320

FOREIGN PATENT DOCUMENTS

WO    WO 200113414    2/2001

OTHER PUBLICATIONS

Thio, T. et al., "Giant Magnetoresistance Enhancement in Inhomogeneous Semiconductors", Applied Physics Letters, vol. 72, No. 26, Jun. 29, 1998.

(List continued on next page.)

Primary Examiner—Safet Metjahic
Assistant Examiner—Subhash Zaveri
(74) Attorney, Agent, or Firm—Scully, Scott, Murphy & Presser (57) ABSTRACT

Mesoscopic magnetic field sensors which can detect weak magnetic fields (typically 0.05 Tesla) over areas as small as tens of thousands of square nanometers (e.g. 40 nm×400 nm). The combination of enhanced magneto-resistance in an inhomogeneous high mobility semiconductor, having special electrode arrangements, with the use of island lithography, enables the production of special semiconductor/metal nano-composite structures, and has made possible the fabrication of an entirely new type of magnetic field sensor which exhibits very superior magneto-resistive behavior.

46 Claims, 5 Drawing Sheets

OTHER PUBLICATIONS

DeJule, R., "Next–Generation Lithography Tools: The Choices Narrow", Semiconductor International, Mar. 1999.

Heremans, J.P., "Magnetic Field Sensors for Magnetic Position Sensing in Automotive Applications", Mat. Res. Soc. Symp. Proc., vol. 475, 1997.

Tsuchiya, S. et al., "Structural Fabrication Using Cesium Chloride Island Arrays as a Resist in a Fluorocarbon Reactive Ion Etching Plasma", Electrochemical and Solid–State Letters, vol. 3, No. 1, 2000.

Zawadzki, W., "Electron Transport Phenomena in Small–Gap Semiconductors", Adv. Phys., 23, 1974.

Foulon, F., et al., "Laser Projection–Patterned Etching of (100) GaAs by Gaseous HCl and $CH_3Cl$", Applied Physics A, 60, 1995.

Deckman, H.W. et al., "Natural Lithography", Applied Physics Letters, vol. 41, No. 4, 1982.

Driskill–Smith, A.A.G. et al., "Fabrication and Behavior of Nanoscale Field Emission Structures", J. Vac. Sci. Technol. B, vol. 15, No. 6, Nov./Dec. 1997.

Green, M. et al., "Quantum Pillar Structures on $n^+$ Gallium Arsenide Fabricated Using "Natural" Lithography", Applied Physics Letters, vol. 62, No. 3, Jan. 18, 1993.

Green, M. et al., "Mesoscopic Hemisphere Arrays For Use as Resist in Solid State Structure Fabrication", J. Vac. Sci. Technol. B, vol. 17, No. 5, Sep./Oct. 1999.

Lyons, E.H., "Modern Electroplating: Chapter 1—Fundamental Principles", John Wiley & Sons, Inc.

Chung, S.J. et al., "The Dependence on Growth Temperatures of the Electrical and Structural Properties of GASb/InAs Single Quantum Well Structures Grown by MBE", presented at the $22^{nd}$ Int. Symp. Compound Semiconductors, Cheju Island, Korea, Aug. 28–Sep. 2, 1995.

\* cited by examiner

FIG. 5

MESOSCOPIC NON-MAGNETIC SEMICONDUCTOR MAGNETORESISTIVE SENSORS FABRICATED WITH ISLAND LITHOGRAPHY

BACKGROUND OF THE INVENTION

The present invention provides mesoscopic magnetic field sensors operating under normal ambient conditions which can detect weak magnetic fields (typically 0.05 Tesla) over areas as small as tens of thousands of square nanometers (e.g. 40 nm×400 nm). The combination of magnetoresistance in an inhomogeneous high mobility semiconductor, having special electrode arrangements, with the use of island lithography, enables the production of special semiconductor/metal nano-composite structures, and has made possible the fabrication of an entirely new type of magnetic field sensor which exhibits very superior magnetoresistive behavior.

SUMMARY OF THE INVENTION

Accordingly, it is a primary object of the present invention to provide mesoscopic non-magnetic semiconductor magnetoresistive sensors fabricated with island lithography and a commercially feasible method of fabricating such magnetoresistive sensors.

In accordance with the teachings herein, the present invention provides a mesoscopic magnetoresistive sensor fabricated utilizing island lithography to form an inhomogeneous high mobility semiconductor with metal inclusions in a nano-composite structure having enhanced magnetoresistance. The nano-composite structure is provided with enhanced magnetoresistance in an InSb (indium antimonide) semiconductor matrix by the addition thereto of a relatively small amount of silicon donors. The enhanced or boosted magnetoresistance in an inhomogeneous narrow-gap InSb semiconductor is combined with island lithography to provide a new type of mesoscopic magnetic sensor.

BRIEF DESCRIPTION OF THE DRAWINGS

The foregoing objects and advantages of the present invention for mesoscopic non-magnetic semiconductor magnetoresistive sensors fabricated with island lithography may be more readily understood by one skilled in the art with reference being had to the following detailed description of several preferred embodiments thereof, taken in conjunction with the accompanying drawings wherein like elements are designated by identical reference numerals throughout the several views, and in which.

DETAILED DESCRIPTION OF THE INVENTION

Figure 1:
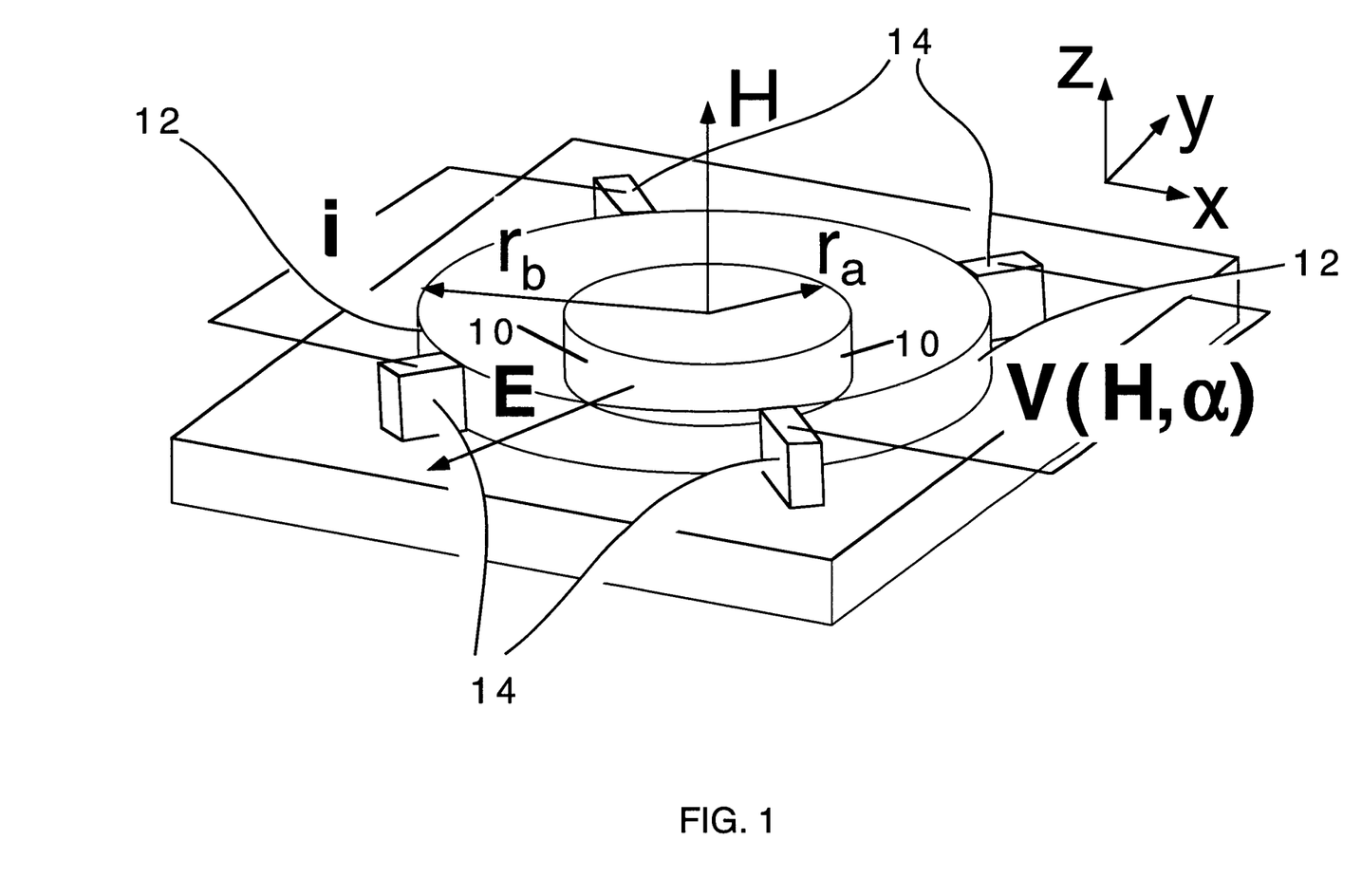
FIG. 1 is a schematic illustration of a concentric cylindrical inhomogeneity having a radius $r_a$ embedded in a homogeneous InSb (indium antimonide) van der Pauw disk having a radius $r_b$.

A slab of high mobility semiconductor containing a single concentric cylindrical metal inclusion (e.g. a conducting inhomogeniety) in a van der Pauw electrode arrangement as shown in FIG. 1 exhibits extraordinary magnetoresistance behavior at room temperature when the metal forms a substantial fraction of the sensed area (Tineke Thio and S. A. Solin, "Giant magnetoresistance enhancement in inhomogeneous semiconductors", Appl. Phys. Lett, 72, 3497–3499 (1998)).

FIG. 1 is a schematic illustration of a concentric cylindrical inhomogeneity 10 having a radius $r_a$ embedded in a homogeneous InSb van der Pauw disk 12 having a radius $r_b$. The electric field E is normal to the interface between the semiconductor van der Pauw disk 12 and the inhomogeneity 10. The vector H represents a uniform magnetic field in the z-direction. The van der Pauw disk 12 and four equally spaced contact pads 14 are formed as an etched mesa. The wiring configuration as shown applies to the measurement of magnetoresistance.

Figure 2:
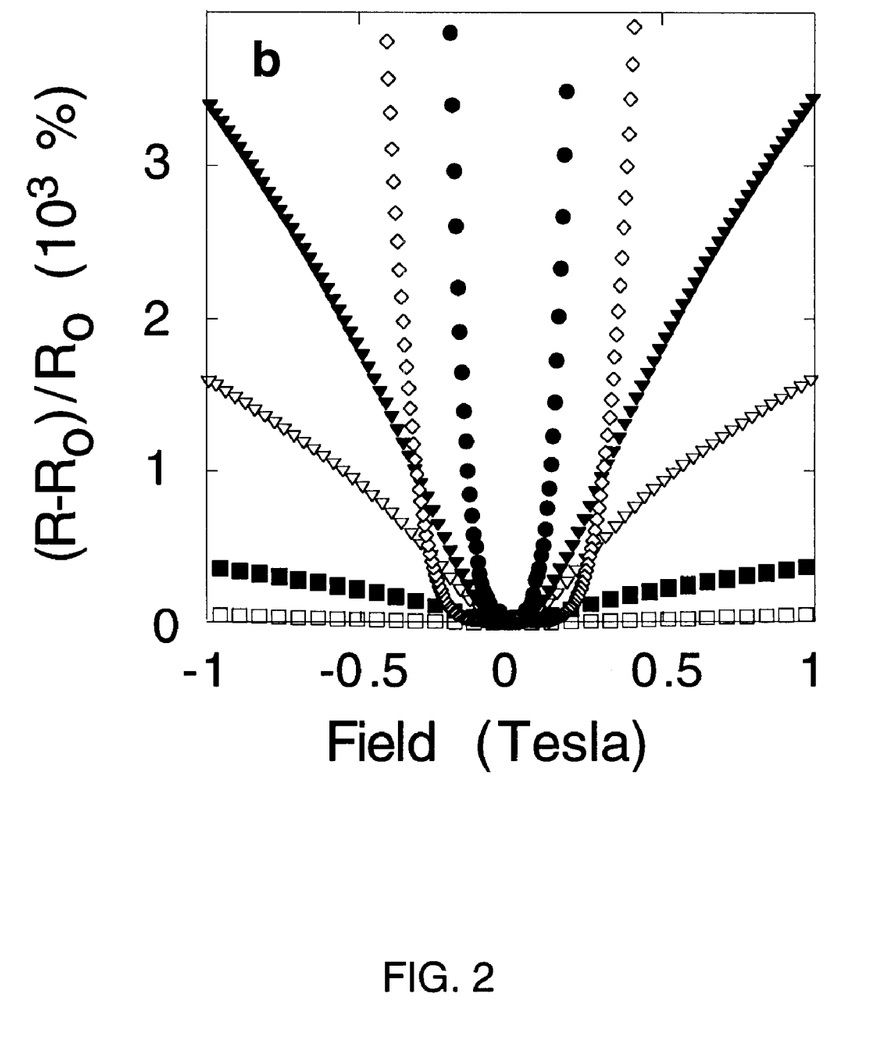
FIG. 2 illustrates exemplary data on the magnetoresistance measured from a structure as shown in FIG. 1.

FIG. 2 illustrates exemplary data on the magnetoresistance measured from a structure as shown in FIG. 1. FIG. 2 illustrates plots of room temperature magnetoresistance vs. magnetic field of a composite van der Pauw disk of InSb and Au (as illustrated in FIG. 1) for a number of values of $=r_a/r_b$. The symbols correspond to $16\alpha=0-\square$, $6-\blacksquare$, $8-\triangledown$, $9-\blacktriangledown$, $13-\bullet$, $14-\diamond$.

In addition to showing extraordinary magnetoresistance, such structures also exhibit extremely useful figures of merit. For instance for devices used in a bridge circuit, the figure of merit is defined as $(1/R)(dR/dH)$ where R is the resistance (J. P. Heremans, "Magnetic field sensors for magnetic position sensing in automotive applications", Mat. Res. Soc. Symp. Proc. 475, 63–74 (1997)). Typical room temperature values are ~2.5/T for a bias field of 0.25 T, whereas macroscopic devices of the type described above have achieved a figure of merit of 24/T at a lower field of 0.05 T.

A "miniaturization" of the above type of structure is highly desirable for a range of applications. However, such miniaturization raises the significant technological difficulty of introducing conducting inhomogeneities of mesoscopic size into a semiconductor matrix in a cost effective way that is practical for large scale production. It is in this context that the present invention employs island lithography. Island lithography provides a newly developing cost effective lithographic technique for preparing very small (10 nm–1200 nm) closely spaced holes in large area thin films of various materials (Shin Tsuchiya, Mino Green and R. R. A. Syms, "Structural fabrication using cesium chloride island arrays as a resist in a flurocarbon reactive ion etching plasma", Electrochemical and Solid State, Lett., 3, 44 (2000)). The present invention combines the two above-described concepts, namely a) enhanced or "boosted" magnetoresistance in inhomogeneous narrow-gap semiconductors (S. A. Solin and T. Thio, "GMR Enhancement in Inhomogeneous Semiconductors for Use in Magnetoresistance Sensors," U.S. Pat. No. 5,965,283) and b) island lithography (United Kingdom Patent Application Number 9919470.7, entitled "Island Arrays", filed on Aug. 17, 1999 in the name of Imperial College of Science, Technology and Medicine), to achieve a new type of mesoscopic magnetic sensor.

A myriad of applications exist for very small magnetic sensors fabricated from nano-composites of the type described above. The description herein focuses on a key application, a read-head sensor for very high density (up to 100 Gb/in$^2$) information storage to illustrate some of the generic features of such sensors.

Figure 3:
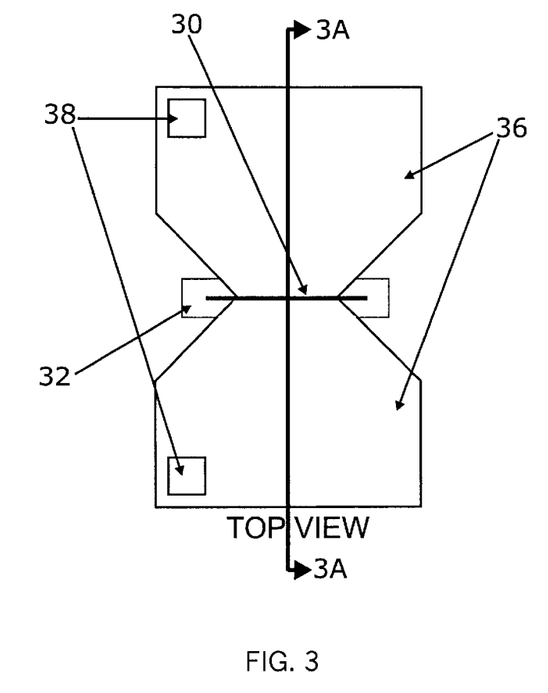
FIG. 3 is a schematic illustration of a planar structure of a read-head for use in high density recording systems, based upon a novel combination of design, materials and fabrication.
Figure 3A:
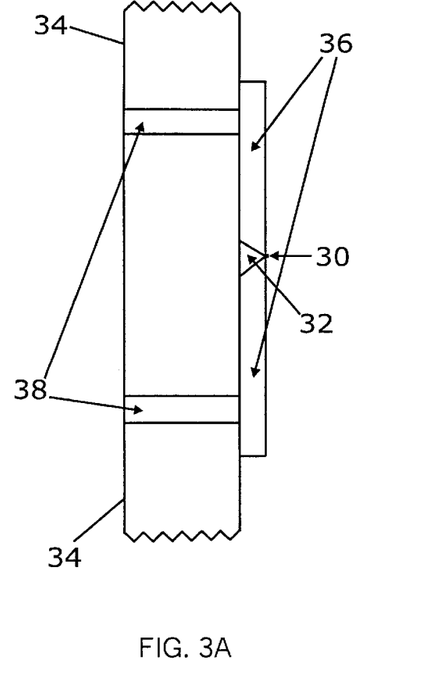
FIG. 3A is a cross section of the read-head of FIG. 3 taken along line 3A—3A.

FIG. 3 is a schematic illustration of a planar structure of a read-head for use in high density recording systems, based upon a novel combination of design, materials and fabrication, and FIG. 3A is a cross section of the read-head of FIG. 3 taken along line 3A—3A.

The read-head comprises a composite enhanced magnetoresistive material 30 supported on top of a buffer material 32 on which the composite material 30 rests, all of which are supported by a substrate 34, on top of which metal leads 36 extend to the composite material 30, which are connected to vias 38 extending to the back of the substrate 34.

The read-head device has the following three essential characteristics.

1. The resistance is measured in the structure of a strip or slab 30 of a composite material wherein the distance between the measuring leads 36 is short compared with the length of the measured slab 30. The purpose of this restriction is that, in the presence of a magnetic field with a component normal to the plane of the device, the Hall field is effectively short-circuited.
2. The semiconductor is a thin strip or slab 30 of high mobility semiconductor material. The requirement for high mobility arises from the physical relation for the magnetoresistance which, at a low magnetic field, is proportional to $(\mu H)^2$ where $\mu$ is the mobility and H is the applied magnetic field. High mobility can be achieved in InSb thin layers because of recent advances in materials science (see discussion below).
3. The semiconductor strip or slab is fabricated from a composite material such that it contains rod-like metal inclusions which normally (at zero or low magnetic fields) facilitate an electrically low resistance path through the semiconductor. However as the magnetic field is raised, there comes a point where the current is excluded from the metal inclusions, thereby forcing the current to follow a tortuous and relatively high resistance path through the strip or slab (Tineke Thio and S. A. Solin, "Giant magnetoresistance enhancement in inhomogeneous semiconductors", Appl. Phys. Lett, 72, 3497–3499 (1998)).

Read-Head Device Structure

Figure 4:
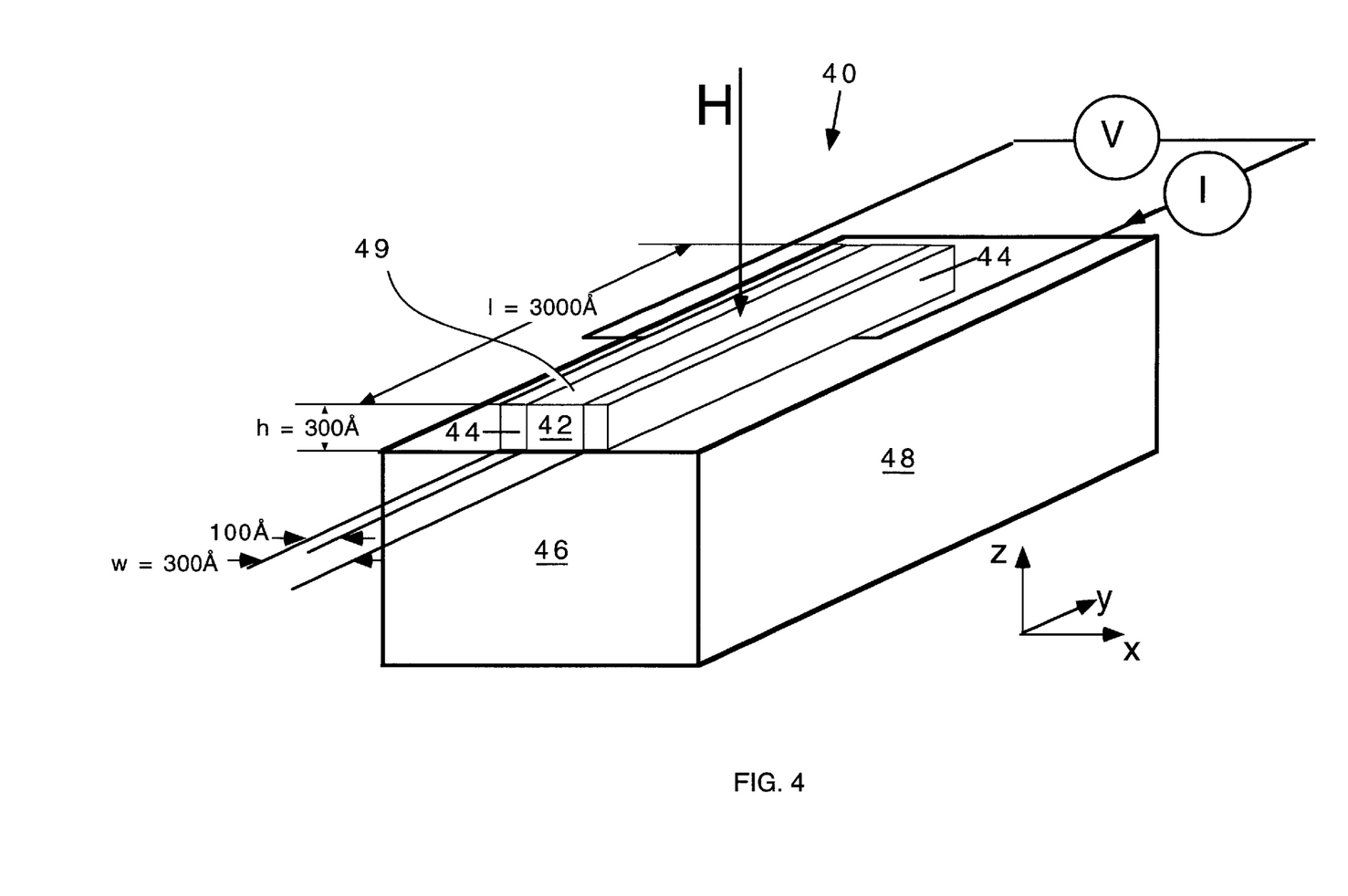
FIG. 4 is a schematic illustration of one embodiment of a read-head for magnetoresistive sensing using a strip or slab of composite material, in which the rod axes of the embedded metallic cylindrical inhomogeneities in the composite are in the z-direction, and shows relevant dimensions and orientations of critical components.

FIG. 4 is a schematic illustration of one embodiment of a read-head 40 for magnetoresistive sensing using a strip or slab 42 of composite material, in which the rod axes in the composite are in the z-direction, and shows relevant dimensions and orientations of critical components. The slab 42 of high-mobility semiconductor/metal nano-composite is contacted on each side by a metallic contact electrode 44, as shown, to form a capacitive structure. This structure is supported by an insulating substrate 46 which also provides a vertical-mounting surface 48 used to attach the read-head 40 to a fly-head (not shown). The direction of the current and the magnetic field are also indicated in FIG. 4, as is the face 49 of the read-head which will be in close proximity to a disk media being scanned or read by the read-head.

For the configuration of field and current flow depicted in FIG. 4, the Lorentz-force-induced space charge which is developed on opposite ends of the slab along the y direction is shorted out by the contact electrodes 44. The resultant electric field in the device is equivalent to that of a Corbino disk for which the geometric contribution to the magnetoresistance is maximal (for a homogeneous slab). Thus, the design shown in FIG. 4 is advantageous for enhancing the sensitivity of the read head.

Another advantage of the structure shown in FIG. 4 is that it yields a data rate time constant which is not only very short but is also independent of the size of the read-head. This advantage follows from the formulation below.

The resistance of the composite slab is R=$\rho$w/hl where $\rho$ is the effective resistivity of the composite and w, h, and l are indicated in FIG. 4. The capacitance of the composite is C=$\epsilon$hl/w where $\epsilon$ is the effective dielectric constant of the composite. The time constant is then t=RC=$\rho\epsilon$ which is size-independent. For pure InSb at room temperature t<10$^-$$^{15}$ sec. This value can be further reduced by a composite material having a lower effective dielectric constant and a lower effective resistivity at zero magnetic field. Since the RC time constant is so short, other factors such as the inverse plasmon cut-off frequency, which is in the pico-second range, are likely to be determining factors in the response time of the read-head structure shown in FIG. 4.

FIG. 4 illustrates a first embodiment having parallel electrodes 44, 44. Alternative embodiments of electrodes can be envisioned. For example, a single one of the electrodes 44 can be subdivided into four discrete sections, two of which carry current and two of which are used for voltage measurement, in which case the second electrode 44 functions as an additional current deflecting element, in addition to the embedded metallic rods.

Semiconductor Matrix Material for the Nano-Composite

The matrix material of the nano-composite magnetic sensor is preferably a narrow gap semiconductor (NGS) because such materials have a high phonon-limited room-temperature carrier mobility, $\mu_{300}$. For instance, for bulk InSb $\mu_{300}$=7.8 m$^2$/Vs, while for InAs (indium arsenide) $\mu_{300}$=3 m$^2$/Vs[10]. An additional advantage of NGS is its low Schottky barrier (W. Zawadzki, "Electron transport phenomena in small-gap semiconductors", Adv. Phys. 23, 435–522 (1974)). This feature avoids the depletion of carriers in the semiconductor by the artificially-structured metallic inclusions and ensures good electrical contacts.

InSb is a favored material because of its higher mobility. However there is a problem associated with the growth of thin films of this material. InSb by itself cannot be used as a substrate in a magnetic sensor because of its very large parallel conductance. No other III–V binary compound or group IV substrate is lattice matched to InSb. Therefore GaAs (gallium arsenide) (lattice mismatch is 14%) is usually employed for reasons of cost and convenience.

Figure 5:
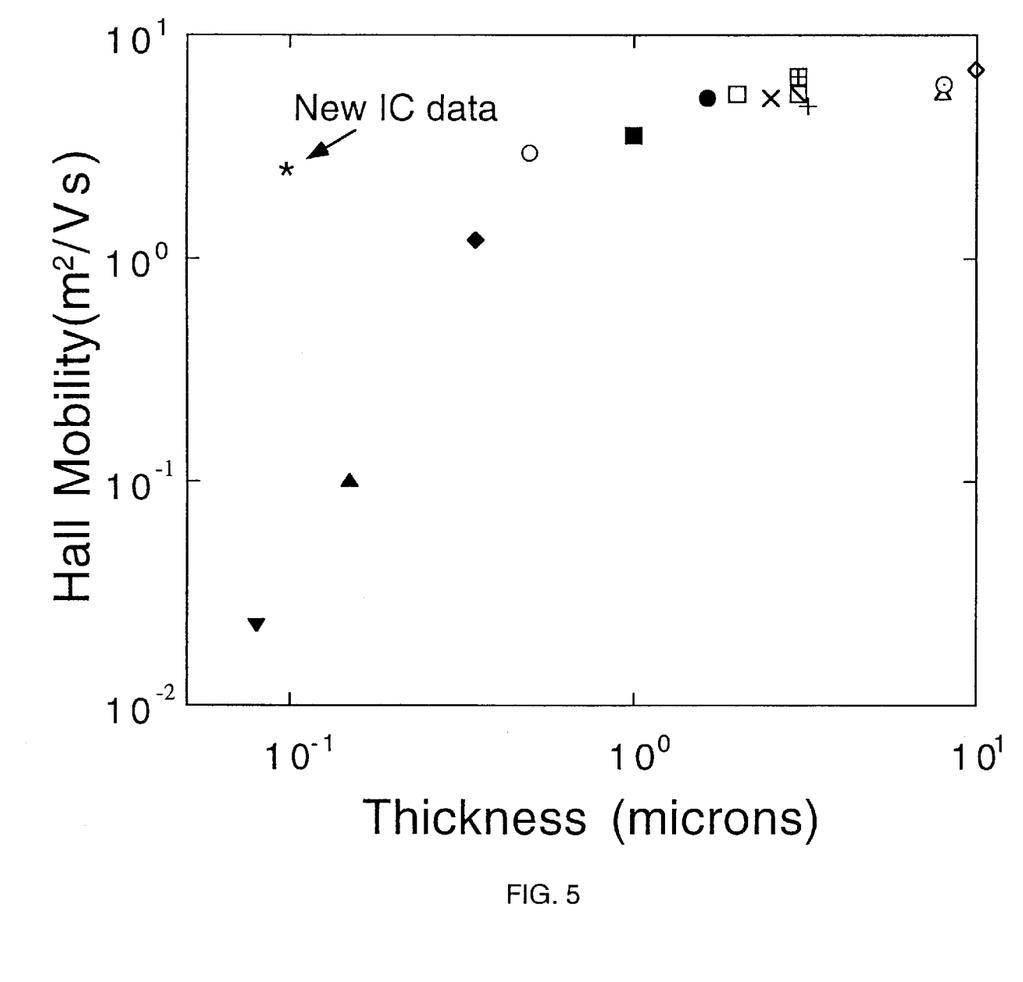
FIG. 5 illustrates plots of data of the room-temperature dependence of the Hall mobility of InSb thin films on film thickness for lightly doped or undoped samples.

FIG. 5 illustrates plots of data of the room-temperature dependence of the Hall mobility of InSb thin films on film thickness for lightly doped or undoped samples. The data is a compilation of published material from a number of authors, except for the data point labeled "New IC data".

For undoped or low-doped films of InSb grown directly onto (001) GaAs substrates, there is a dramatic decrease in the Hall mobility as a function of film thickness, as indicated in FIG. 5. Mobilities approaching the phonon-limited value have only been measured at room temperature when the film thickness exceeds ten microns. Typically 4 m$^2$/Vs is measured at 1 micron thickness. At 100 nm thickness (the maximum thickness which is acceptable for the next generation of read-heads) the mobility is only ~10$^{-2}$ m$^2$/Vs. The rapid degradation in mobility as the thickness is reduced is matched by an almost as rapid decrease in the Hall constant (or increase in the apparent carrier concentration). The figures above are typical of all undoped/lightly doped InSb films (provided that the background doping level is ~$10^{16}$ cm$^{-3}$ or less) grown at thicknesses greater than the critical thickness (one monolayer for InSb on GaAs), and have been reported by many workers using different epitaxial growth methods on a number of different mismatched substrates (including silicon), as indicated in FIG. 5. This degradation is associated with the presence of misfit dislocations generated at the interface between the InSb and the substrate.

This size effect would normally rule out the use of InSb as a matrix material for such nano-composites. However, it has been demonstrated that the mobility for 0.10 μm films jumps from ~$10^{-2}$ m$^2$/Vs to 3 m$^2$/Vs (i.e. by more than two orders of magnitude) if a relatively small amount (~$3\times10^{17}$ cm$^{-3}$) of silicon donors is added, as shown by the data point labeled "New IC data" in FIG. 5. This is adequate for read-head purposes. Other electron donors such as tellurium may produce the same effect.

Other high mobility semiconductors may exhibit a similar degradation in mobility with decreasing thickness. This degradation may be eliminated by the addition of donors similar to the case of InSb.

Insertion of intermediate buffer layers of In$_{1-x}$Al$_x$Sb or the growth on non-standard substrate orientations for the GaAs (e.g. 111A) may additionally ameliorate the reduction in mobility with film thickness.

For smaller thicknesses of sensor material, it may be preferable to use InAs/AlSb/GaSb quantum well wafers which can be routinely grown on GaAs substrates with phonon limited values of mobility at room temperature (S. J. Chung, A. G. Norman, W. T. Yuen, T. Malik and R. A. Stradling, "The Dependence on Growth Temperatures of the Electrical and Structural Properties of GaSb/InAs Single Quantum Well Structures grown by MBE", Proc. of 22$^{nd}$ Int. Symposium on Compound Semiconductors IoP Conf. Ser. 145, 45–50 (1996)). These structures can be grown as thin as 10 nm without degradation of the mobility. There are two other advantages to InAs based structures: a) a tendency to surface/interface accumulation produces the equivalent of remote doping in a nanostructured composite InAs/metal material b) stronger chemical bonds in InAs permit higher temperatures for both fabrication and operation.

The Composite Material

A desired composite structure consists of a semiconductor slab containing well-like holes filled with metal. This can be fabricated over various restricted size ranges using several methods. Ion projection lithography (R. Dejule, "Semiconductor International" 22, No. 3, 48–52 (1999)) or electron beam writing systems can be employed to write suitable patterns in resist material. However this becomes a less and less practical industrial method as the well diameter decreases. Another beam system can employ laser writing (Francois Foulon and Mino Green, "Laser projection patterned etching of (100) GaAs by gaseous HCL and Ch$_3$Cl" Applied Physics A, 60, 377–381 (1995)), which is restricted to sizes of the order of the available laser wavelengths. A desired composite structure can also be fabricated by various "natural lithographies". One natural lithography employs a two dimensional array of polystyrene spheres (H. W. Deckman and J. H. Dunsmuir, "Natural Lithography", Appl. Phys. Lett., 41,377 (1992)). Arrays of about 300 nm feature size and spacing have been made using this method. More recently metal grains of AuPd have been used (A. A. G. Driskill-Smith, D. G. Hasko and H. Ahmed, "Fabrication and behavior of nanoscale field emission structures". J.Vac. Sci. Technol., B, 15, 2773 (1997)). However, none of these techniques have the combination of range, simplicity, packing density and low cost of an island lithography method using CsCl.

Structural Fabrication Using Cesium Chloride Island Arrays as Resist in a Reactive Ion Etching Plasma Very thin films of cesium chloride deposited on a hydrophilic substrate, when exposed to water vapor under controlled conditions, will re-organize into a hemispherical island array (M. Green, M. Garcia-Parajo and K. Khaleque, "Quantum pillar structures on n+gallium arsenide fabricated using natural lithography", Appl. Phys. Lett., 62, 264 (1993)). The characteristics of the array are that it is partially disordered and near to a truncated Gaussian in size distribution: the array is described by a fractional coverage (F) called "packing density", with islands of a mean diameter (<d>), having a particular standard deviation. A detailed study was recently completed of the kinetics and mechanism of formation of CsCl hemispherical island arrays on an oxidized silicon surface, and demonstrated that this technique can be used as a well controlled process for producing island arrays with known characteristics (Mino Green and Shin Tsuchiya, "Mesoscopic hemisphere arrays for use as resist in solid state structure" J. Vac. Sci. & Tech. B, 17, 2074–2083 (1999)). Arrays have been formed with <d> ranging from 10 to 1200 nm (ca.±17%) and F values over the range 10–80%.

Distributions of such CsCl island arrays have previously been used as a resist in the reactive ion etching (RIE) (chlorine based) fabrication of mesoscopic pillar structures on n$^+$GaAs (M. Green, M. Garcia-Parajo and K. Khaleque, "Quantum pillar structures on n+gallium arsenide fabricated using natural lithography", Appl. Phys. Lett., 62, 264 (1993)). The measured photoluminescent spectra showed large band gap increases arising from quantum confinement effects. As mentioned above, there have been other proposed approaches to "nano-scale" lithography using self-organising systems. However the method used here is thought to be the best controlled and the most versatile of those available. This technique is used to make nano-scale devices that involve the fabrication of pillars, cones or wells. Pillars and conical ("tip") structures are fabricated in a positive resist scheme, while wells of special interest here can be fabricated using a lift-off process involving the use of a metal thin film. An example is a well fabricated into SiO$_2$ on Si. The control of wall angle for tip and well fabrication is important and has been achieved. Apart from producing the CsCl island resist arrays, a key process step is RIE (Shin Tsuchiya, Mino Green and R. R. A. Syms, "Structural fabrication using cesium chloride island arrays as a resist in a flurocarbon reactive ion etching plasma", Electrochemical and Solid State, Lett., 3, 44 (2000)).

The ability to make the three basic structures, pillar, cone and well, in the mesoscopic size range with a fairly narrow size distribution and up to a high packing density makes this technique of "island lithography" attractive in a number of fields, e.g. high density field emission; magnetoresistive composites; lithium/silicon anodes in batteries; isolated modulation doping sources, etc. No other high feature-density resist scheme is known which compares in range and cost with the island lithography described above.

A typical lift-off process for ultra-small hole fabrication in InSb or InAs may be achieved as follows. Deposit a thin layer, e.g. 6.6 nm, of CsCl on a hydrophilic InSb or InAs semiconductor surface. Develop in a 20% relative humidity atmosphere for 5 mins. The resulting island array will be of average diameter 45 nm (±14 nm) and fractional packing density 0.46. This array is now coated in aluminum to an average depth of 30 nm. This system is then transferred to an ultrasonic tank containing clean water and agitated for 2 mins. The result is complete lift-off of the aluminum covering the CsCl islands, leaving behind InSb or InAs coated in aluminum with an array of holes matching the developed CsCl array. The aluminum can now function as a resist in a plasma reactive ion etching (RIE) scheme using methane and hydrogen. The conditions of etching are adjusted to give a wall angle of about 85 degrees. After etching, the aluminum is chemically removed (e.g. 20% NaOH at 70° C.), leaving the semiconductor with a high density of empty wells ready for metal filling.

These empty wells are then filled with a conducting metal. Typically, a non-magnetic metal such as gold can be used. However, a ferromagnetic metal such as Ni or a magnetic alloy can be used to metallize the holes since such materials can be used to further control/tailor the magnetoresistive properties. For instance, the dependence of the magnetoresistance of the sensor on the applied magnetic field can be further enhanced by the presence of a local field of a magnetic conducting inhomogeneity.

The wells which require metallization go completely through the InSb layer into a relatively poorly conducting buffer layer. The filling of such wells can be accomplished in several ways. Firstly, by electrochemical deposition (electroplating) of non-magnetic metals, e.g. copper, gold, silver, aluminium, zinc, cadmium, or of magnetic metals, e.g. iron, nickel, chromium (E. H. Lyons in "Modern Electroplating", F. A. Lowenheim, Ed., (Wiley, N.Y., 1974) Chapter 1, $3^{rd}$ Ed). If a constant potential system is used, the current can be monitored to indicate the onset of the completion of the filling of holes, since the completion is accompanied by a reduction in surface area and hence a reduction in current. Another method is to vapor deposit the metal onto a hot substrate, which ensures high metal surface mobility and consequent hole filling and a smooth surface. The excess metal can be removed by a combination of etching and oxidation. Finally wells of order 10 nm diameter can be filled by capillary condensation (D. H. Everett and F. S. Stone, Eds., "Structure and Properties of Porous Materials" Butterworths Sci. Pub., 68–94, 1958) by those metals that have a sufficient vapor pressure at the maximum process temperature of the semiconductor. Thus zinc and cadmium will work well for InSb or InAs.

While several embodiments and variations of the present invention for mesoscopic non-magnetic semiconductor magnetoresistive sensors fabricated with island lithography are described in detail herein, it should be apparent that the disclosure and teachings of the present invention will suggest many alternative designs to those skilled in the art.

What is claimed is:

1. A method of measuring weak magnetic fields comprising:

utilizing island lithography to fabricate a mesoscopic magnetic sensor in an inhomogeneous high mobility semiconductor with metal inclusions in a nano-composite structure having enhanced magnetoresistance; and measuring the magnetoresistance in the fabricated inhomogeneous high mobility semiconductor nano-composite structure.

2. The method as claimed in claim 1, wherein the semiconductor comprises a narrow gap semiconductor which provides a high phonon-limited room-temperature carrier mobility $\mu_{300}$ and a low Schottky barrier which avoids depletion of carriers in the semiconductor by the metal inclusions and ensures good electrical contacts.

3. The method as claimed in claim 1, wherein the semiconductor comprises one of InSb (indium antimonide) and InAs (indium arsenide).

4. The method as claimed in claim 3, wherein the Hall mobility of the semiconductor is enhanced by the addition of electron donors thereto.

5. The method as claimed in claim 4, wherein the mesoscopic magnetic sensor comprises a read-head having a thickness of 100 nm or less.

6. The method as claimed in claim 1, wherein an intermediate buffer layer of $In_{1-x}Al_xSb$ is positioned below the inhomogeneous semiconductor composite structure.

7. The method as claimed in claim 1, wherein the semiconductor comprises InAs which has a tendency to surface/interface accumulation to produce the equivalent of remote doping, and strong chemical bonds which permit higher temperatures for both fabrication and operation.

8. The method as claimed in claim 1, wherein the island lithography is employed as a lithographic technique for preparing very small (10 nm–1200 nm) closely spaced holes in a thin film of the semiconductor.

9. The method as claimed in claim 1, wherein a slab of the high-mobility semiconductor/metal nano-composite is contacted on each side by a metallic contact electrode, to form a capacitive structure, supported on an insulating substrate.

10. The method as claimed in claim 9, wherein a Lorentz-force-induced space charge which is developed on opposite sides of the slab is shorted out by the contact electrodes, and a resultant electric field in the device is equivalent to that of a Corbino disk for which the geometric contribution to the magneto-resistance is maximal, enhancing magnetic sensitivity.

11. The method as claimed in claim 9, wherein the inhomogeneous semiconductor is provided as a slab, and the distance between the contact electrodes is short compared with the length of the measured slab, such that in the presence of a magnetic field with a component normal to the plane of the device, the Hall field is effectively short-circuited.

12. The method as claimed in claim 1, wherein a thin slab of semiconductor is fabricated into a composite structure containing rod-like metal inclusions which normally, at zero or low magnetic field, facilitate an electrically low resistance path through the semiconductor, and as the magnetic field is raised, a point is reached where the current is excluded from the metal inclusions, thereby forcing the current to follow a tortuous and relatively high resistance path through the slab.

13. The method as claimed in claim 1, wherein the nano-composite structure comprises a semiconductor slab containing well-like holes filled with metal.

14. The method as claimed in claim 1, wherein the fabricating step uses cesium chloride island arrays as a resist in a reactive ion etching step.

15. The method as claimed in claim 14, wherein a thin film of cesium chloride is deposited on a hydrophilic semiconductor substrate, which when exposed to water vapor, reorganizes into a hemispherical island array.

16. The method as claimed in claim 15, used to fabricate nano-scale pillars or conical tip structures fabricated in a positive resist.

17. The method as claimed in claim 16, used to fabricate nano-scale well-like holes, fabricated using a lift-off process which uses a metal thin film.

18. The method as claimed in claim 17, wherein the well-like holes are fabricated into $SiO_2$ on Si.

19. The method as claimed in claim 14, comprising a lift-off process for ultra-small hole fabrication in InSb or InAs by depositing a thin layer of CsCl on a hydrophilic InSb or InAs semiconductor surface, developing in a relative humidity atmosphere resulting in the formation of an island array, coating the island array with aluminum, agitating the coated structure in an ultrasonic water tank resulting in a complete lift-off of the aluminum covering the CsCl islands, leaving behind InSb or InAs coated in aluminum with an array of holes matching the developed CsCl array, using the aluminum as a resist in a plasma reactive ion etching operation using methane and hydrogen, then chemically removing the aluminum, leaving the InSb or InAs semiconductor with a high density of empty holes, and filling the empty holes with a conducting metal.

20. The method as claimed in claim 19, wherein the holes are filled with a non-magnetic metal such as gold.

21. The method as claimed in claim 19, wherein the holes are filled with a ferromagnetic metal or magnetic alloy to metallize the holes and to control the magnetoresistive properties, to enhance the dependence of the magnetoresistance of the sensor on the applied magnetic field by the presence of a local field of a magnetic conducting inhomogeneity.

22. The method as claimed in claim 19, wherein the holes are filled by electrochemical deposition (electroplating) of a non-magnetic metal comprising one of copper, gold, silver, aluminum, zinc and cadmium, or of a magnetic metal comprising one of iron, nickel and chromium.

23. The method as claimed in claim 19, wherein the holes are filled by vapor depositing a metal onto a hot substrate, which ensures high metal surface mobility and consequent hole filling and a smooth surface, and removing excess metal by a combination of etching and oxidation.

24. The method as claimed in claim 19, wherein holes of order 10 nm diameter are filled by capillary condensation by metals having a sufficient vapor pressure at the maximum process temperature of the semiconductor, such as zinc and cadmium for InSb or InAs.

25. A mesoscopic magnetoresistive sensor fabricated with island lithography for measuring weak magnetic fields comprising:

a mesoscopic magnetic sensor fabricated utilizing island lithography to form an inhomogeneous high mobility semiconductor with metal inclusions in a nano-composite structure having enhanced magnetoresistance;

means for measuring the magnetoresistance in the fabricated inhomogeneous high mobility semiconductor nano-composite structure.

26. The mesoscopic magnetoresistive sensor as claimed in claim 25, wherein the semiconductor comprises a narrow gap semiconductor which provides a high phonon-limited room-temperature carrier mobility $\mu_{300}$ and a low Schottky barrier which avoids depletion of carriers in the semiconductor by the metal inclusions and ensures good electrical contacts.

27. The mesoscopic magnetoresistive sensor as claimed in claim 25, wherein the semiconductor comprises one of InSb (indium antimonide) and InAs (indium arsenic).

28. The mesoscopic magnetoresistive sensor as claimed in claim 27, wherein the Hall mobility of the semiconductor is enhanced by the addition of electron donors thereto.

29. The mesoscopic magnetoresistive sensor as claimed in claim 28, wherein the mesoscopic magnetic sensor comprises a read-head having a thickness of 100 nm or less.

30. The mesoscopic magnetoresistive sensor as claimed in claim 25, wherein an intermediate buffer layer of $In_{1-x}Al_xSb$ is positioned below the inhomogeneous semiconductor composite structure.

31. The mesoscopic magnetoresistive sensor as claimed in claim 25, wherein the semiconductor comprises InAs which has a tendency to surface/interface accumulation to produce the equivalent of remote doping, and strong chemical bonds which permit higher temperatures for both fabrication and operation.

32. The mesoscopic magnetoresistive sensor as claimed in claim 25, wherein the island lithography is employed as a lithographic technique for preparing very small (10 nm–1200 nm) closely spaced holes in a thin film of the semiconductor.

33. The mesoscopic magnetoresistive sensor as claimed in claim 25, wherein a slab of the high-mobility semiconductor/metal nano-composite is contacted on each side by a metallic contact electrode, to form a capacitive structure, supported on an insulating substrate.

34. The mesoscopic magnetoresistive sensor as claimed in claim 33, wherein a Lorentz-force-induced space charge which is developed on opposite sides of the slab is shorted out by the contact electrodes, and a resultant electric field in the device is equivalent to that of a Corbino disk for which the geometric contribution to the magneto-resistance is maximal, enhancing magnetic sensitivity.

35. The mesoscopic magnetoresistive sensor as claimed in claim 25, wherein the inhomogeneous semiconductor is provided as a slab, and the distance between the contact electrodes is short compared with the length of the measured slab, such that in the presence of a magnetic field with a component normal to the plane of the device, the Hall field is effectively short-circuited.

36. The mesoscopic magnetoresistive sensor as claimed in claim 25, wherein the inhomogeneous semiconductor is a thin slab of semiconductor fabricated of a composite structure containing rod-like metal inclusions which normally, at zero or low magnetic field, facilitate an electrically low resistance path through the semiconductor, and as the magnetic field is raised, a point is reached where the current is excluded from the metal inclusions, thereby forcing the current to follow a tortuous and relatively high resistance path through the slab.

37. The mesoscopic magnetoresistive sensor as claimed in claim 25, wherein the nano-composite structure comprises a semiconductor slab containing well-like holes filled with metal.

38. The mesoscopic magnetoresistive sensor as claimed in claim 25, wherein a thin film of cesium chloride is formed into a hemispherical island array.

39. The mesoscopic magnetoresistive sensor as claimed in claim 25, wherein nano-scale pillars or conical tip structures are fabricated in a positive resist.

40. The mesoscopic magnetoresistive sensor as claimed in claim 25, wherein nano-scale well-like holes are fabricated using a lift-off process which uses a metal thin film.

41. The mesoscopic magnetoresistive sensor as claimed in claim 40, comprising well-like holes fabricated into $SiO_2$ on Si.

42. The mesoscopic magnetoresistive sensor as claimed in claim 37, wherein the holes are filled with a non-magnetic metal such as gold.

43. The mesoscopic magnetoresistive sensor as claimed in claim 37, wherein the holes are filled with a ferromagnetic metal or magnetic alloy to metallize the holes and to control the magnetoresistive properties, to enhance the dependence of the magnetoresistance of the sensor on the applied magnetic field by the presence of a local field of a magnetic conducting inhomogeneity.

44. The mesoscopic magnetoresistive sensor as claimed in claim 37, wherein the holes are filled with an electrochemical deposition (electroplating) of a non-magnetic metal comprising one of copper, gold, silver, aluminum, zinc and cadmium, or of a magnetic metal comprising one of iron, nickel and chromium.

45. The mesoscopic magnetoresistive sensor as claimed in claim 27, wherein the holes are filled with a vapor deposition of metal.

46. The mesoscopic magnetoresistive sensor as claimed in claim 37, wherein holes of order 10 nm diameter are filled with a capillary condensation of a metal having a sufficient vapor pressure at the maximum process temperature of the semiconductor, such as zinc and cadmium for InSb or InAs.

* * * * *